United States Patent [19]
Huh

[11] Patent Number: 5,853,925
[45] Date of Patent: Dec. 29, 1998

[54] LATERAL DIFFUSION CONFIRMING PATTERN AND A METHOD OF MEASURING A LATERAL DIFFUSION

[75] Inventor: Hoon Huh, Chungcheongbuk-do, Rep. of Korea

[73] Assignee: LG Semicon Co., Ltd., Chungcheongbuk-go, Rep. of Korea

[21] Appl. No.: 803,243

[22] Filed: Feb. 20, 1997

[30] Foreign Application Priority Data

May 2, 1996 [KR] Rep. of Korea ................ 96-14164

[51] Int. Cl.⁶ ........................................ G03F 7/00
[52] U.S. Cl. ...................... 430/11; 430/313; 430/30
[58] Field of Search .................... 430/11, 17, 324, 430/315, 313, 314, 30, 325

[56] References Cited

U.S. PATENT DOCUMENTS

| | | | |
|---|---|---|---|
| 5,094,936 | 3/1992 | Misium et al. | 430/313 |
| 5,403,685 | 4/1995 | Vidusek et al. | 430/324 |
| 5,491,047 | 2/1996 | Kim et al. | 430/324 |
| 5,578,422 | 11/1996 | Mizuno et al. | 430/313 |

OTHER PUBLICATIONS

Promximity effects in dry developed lithograph for sub–0.35 um application, A.M. Goethals et al, IMEC, Kapeldreef 75, 3001 Leuven, Belgium, 349/SPIE vol. 2195, pp. 394–406.

*Primary Examiner*—Kathleen Duda
*Assistant Examiner*—John Vanderwilt

[57] ABSTRACT

A diffusion confirming pattern for measuring a diffusion distance of an etch-resistant component during a transfer process of a semiconductor device, includes a first photoresist pattern formed on a substrate according to a first mask pattern, and a second photoresist pattern formed on the substrate according to a second mask pattern, wherein the first mask pattern is separated from the second mask pattern by a predetermined interval, the second photoresist pattern is separated from the first photoresist pattern by an interval, and the predetermined interval is compared with the interval between the first and second photoresist patterns to determine the diffusion distance of the etch-resistant component.

12 Claims, 3 Drawing Sheets

LATERAL DIFFUSION CONFIRMING PATTERN AND A METHOD OF MEASURING A LATERAL DIFFUSION

BACKGROUND OF THE INVENTION

The present invention relates to a diffusion confirming pattern for a semiconductor device and a method of fabricating and using the same. More particularly, the present invention relates to a method for confirming a lateral diffusion component of a pattern transferred onto a substrate through photolithography, and to a pattern which is capable of easily confirming the lateral diffusion component.

In a fabrication process of a semiconductor device, lithography for transferring a photomask pattern onto a semiconductor wafer is difficult to perform because a fine photomask pattern is required as the integration of the semiconductor device increases.

FIG. 1 shows the relationship between a photomask pattern used for an exposure process of a semiconductor fabrication process, and the intensity of an exposure energy on a photoresist during the exposure.

As shown in FIG. 1, an incident light 12 passing through a pattern 11 of a mask interferes with a neighboring incident light, and is thus diffracted. Accordingly, there is a component of the incident light 12 which impinges on portions of the photoresist covered by the mask 11. This substantially deteriorates the resolution of a lithographic process. The resolution of a lithographic process indicates an ability to transfer small size images onto a substrate. If there are no diffractions and interferences from the incident light 12, it is possible to obtain an ideal light energy distribution as shown in the dotted line 13 of FIG. 1. However, the energy distribution of the incident light 12, in reality, is as shown in FIG. 1 by the solid line 14. Accordingly, the exposure energy is diffused even into the portions of the photoresist shielded by the mask, deteriorating the resolution thereof.

For the purpose of solving the aforementioned problem, the surface imaging technique has been proposed to obtain a high resolution. FIGS. 2A to 2D are cross-sectional views showing the proposed surface imaging technique.

As shown in FIG. 2A, a photoresist layer 22 is formed on the surface of a substrate 21, onto which a pattern will be transferred. The photoresist layer 22 is exposed with a large light energy to expose only a certain surface of the photoresist layer 22 using a pattern 24. By doing so, an exposed portion 23 of the photoresist layer 22 is formed only on the top surface of the photoresist layer 22 as shown in FIG. 2B.

Then, as shown in FIG. 2C, a silylation agent, HMDS (hexamethyldisilane), is reacted with the overall surface of the substrate to permeate Si only into the exposed portion 23, thereby forming a silylation layer of etch-resistant layer 23'. The silylation process is carried out in dry or wet method, and various kinds of agents have been introduced for the silylation process.

As shown in FIG. 2D, the photoresist layer 22 is anisotropically etched using the etch-resistant layer 23' as a mask to form a final silylation layer pattern 22'. The surface imaging technique is disclosed in SPIE vol. 2195, pp. 394–405, "Proximity Effect In Dry Developed Lithography For Sub-0.35$\mu$m Application" and its reference papers.

During the aforementioned fine pattern formation process, however, the silylation agent is diffused, not only in the vertical direction but also in the horizontal direction. This makes the control of its critical dimensions difficult. Even in the above surface imaging technique, the interference and diffraction effects of the incident light, and the diffusion components of the material itself, such as silylation agent, cause the transferred pattern component to be diffused in a lateral direction. Eventually, this results in the deterioration of the final resolution.

Furthermore, there is a problem of detecting the lateral diffusion of the transferred pattern component. Presently, in order to confirm the degree of the lateral diffusion of the silylation agent after performing the surface imaging process, the surface is analyzed using SIMS (Secondary Ion Mass Spectroscopy) apparatus, or a SEM (Scanning Electron Microscopy) photograph is used for a sectioned wafer. But, using these methods it is difficult to determine the degree of lateral diffusion in a semiconductor device.

SUMMARY OF THE INVENTION

It is an object of the present invention to provide a diffusion confirming pattern for a semiconductor device and a method for forming the same, which is capable of confirming a lateral diffusion component, and a method for measuring a diffusion distance of lateral diffusion in a semiconductor device.

To accomplish the above and other objects of the present invention, there is provided a diffusion confirming pattern for measuring a diffusion distance of an etch-resistant component during a transfer process of a semiconductor device, the pattern including a first photoresist pattern formed on a substrate, and a second photoresist pattern formed on the substrate, wherein the second photoresist pattern is separated from the first photoresist pattern by a confirmation interval.

According to the present invention, the diffusion confirming pattern for measuring a diffusion distance of an etch-resistant component during a transfer process of a semiconductor device, includes at least two diffusion confirming unit patterns, each of the unit patterns including a first photoresist pattern formed on a substrate and a second photoresist pattern formed on the substrate, the second photoresist pattern being separated from the first photoresist pattern by a confirmation interval, the diffusion confirming unit patterns being arranged to be connected to one another, the diffusion confirming unit patterns having confirmation intervals different from one another.

To achieve the objects of the present invention, there is further provided a method for measuring a diffusion distance of a transfer pattern formed on a substrate, including the steps of forming a photoresist layer on a substrate; exposing the surface of the photoresist layer using a mask, and forming an etch-resistant component layer on the exposed surface of the photoresist, the mask including a plurality of unit patterns formed thereon, the unit patterns including a plurality of first patterns and a plurality of second patterns, the second patterns being separated from the first patterns by confirmation intervals, the confirmation intervals being different from one another; etching the photoresist layer using the etch-resistant component layer as a mask, to form first and second photoresist patterns, the first and second photoresist patterns respectively corresponding to the first and second patterns of the unit patterns; detecting a diffusion confirming unit pattern from the first and second photoresist patterns; and determining one-half of the largest confirmation interval in the diffusion confirming unit pattern as a lateral diffusion distance during a pattern transfer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a diffusion confirming pattern for measuring a diffusion distance of an etch-resistant component during a transfer process of a semiconductor device, the pattern including a first photoresist pattern formed on a substrate; and a second photoresist pattern formed on the substrate, the second photoresist pattern being separated from the first photoresist pattern by a predetermined interval, whereby the predetermined interval is used to determine the diffusion distance.

The present invention is further directed to a diffusion confirming pattern for measuring a diffusion distance of an etch-resistant component during a transfer process of a semiconductor device, the pattern including at least two diffusion confirming unit patterns, each of the unit patterns including a first photoresist pattern formed on a substrate and a second photoresist pattern formed on the substrate, the second photoresist pattern being separated from the first photoresist pattern by a predetermined interval, wherein the diffusion confirming unit patterns are connected to each other.

The present invention is also directed to a method for forming a diffusion confirming pattern, including the steps of forming a photoresist layer on a substrate; exposing a surface of the photoresist layer using a mask, and forming an etch-resistant component layer on the exposed surface of the photoresist, the mask including a plurality of unit patterns formed thereon, each of the unit patterns including first and second confirming patterns, the second confirming pattern being separated from the first confirming pattern by a predetermined interval; and etching the photoresist layer, using the etch-resistant component layer as a mask, to form first and second photoresist patterns, wherein the first and second photoresist patterns correspond respectively to the first and second confirming patterns.

Furthermore, the present invention is directed to a method for measuring a diffusion distance of a pattern, the method including the steps of providing a plurality of diffusion confirming unit patterns formed on a mask, each of the unit patterns including a first confirming pattern and a second confirming pattern, the first confirming pattern being separated from the second confirming pattern by a predetermined interval, wherein the diffusion confirming unit patterns are connected to each other; transferring the diffusion confirming unit patterns onto a photoresist layer; and calculating a diffusion distance of a photoresist layer using the transferred patterns formed on the photoresist layer.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENTS

Preferred embodiments of the present invention will be explained below with reference to the accompanying drawings. The present invention is for determining and confirming the diffusion degree of an etch-resistant component during the surface imaging of an exposure process. The present invention is for easily detecting the diffusion degree of the etch-resistant component (i.e., the etch-resistant component pattern serving as a mask) when a pattern is transferred to a photoresist layer, or a mask pattern is transferred to a wafer through a photoresist pattern.

Figure 1:
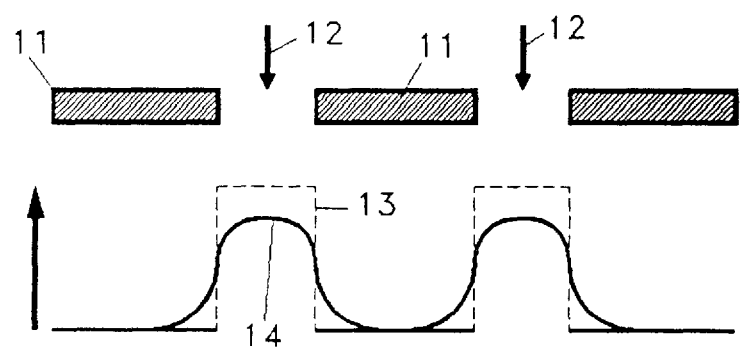
FIG. 1 shows a relationship between a photomask pattern used in an exposure process of a semiconductor fabrication process, and the intensity of an exposure energy on a photoresist during the exposure.
Figure 2A:
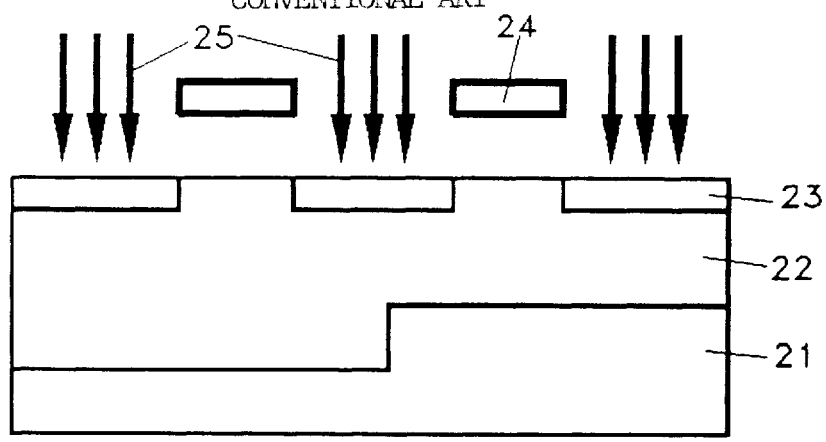
FIGS. 2A to 2D are cross-sectional views showing a conventional surface imaging technique.
Figure 2B:
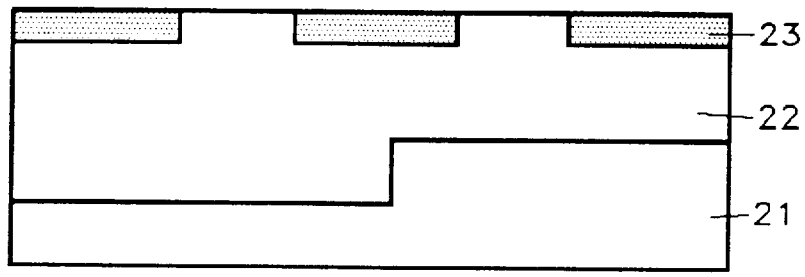
Figure 2C:
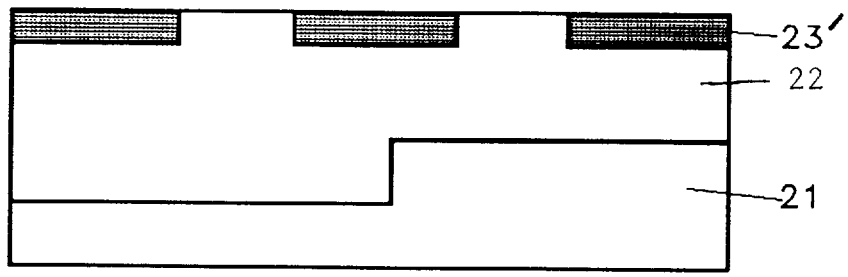
Figure 2D:
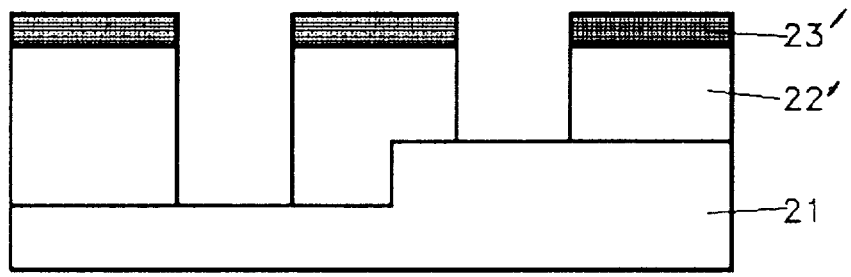
Figure 3:
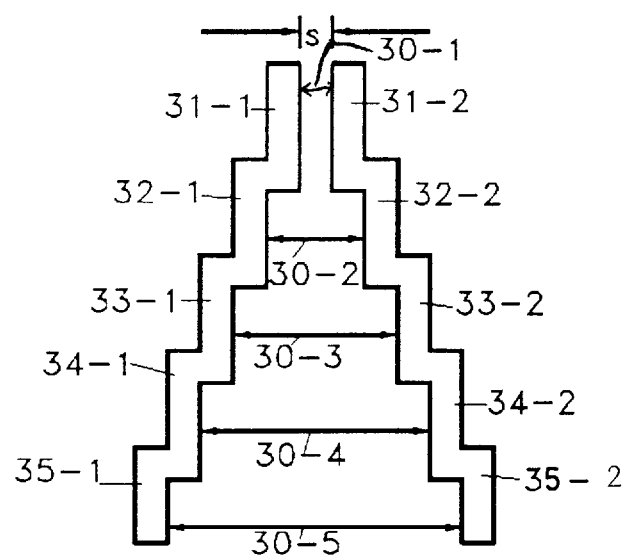
FIG. 3 is a plan view of a pattern for confirming a lateral diffusion of an etch-resistant component according to the embodiments of the present invention.

FIG. 3 is a plan view of a pattern used for confirming a lateral diffusion of an etch-resistant component according to the present invention. The lateral diffusion confirming pattern of the present invention is formed as follows.

A light shielding material, such as chrome is coated on a photomask substrate formed of quartz and is selectively etched to form a mask pattern. This mask pattern for confirming the lateral diffusion of an etch-resistant component, includes a plurality of unit patterns. Each of the unit patterns includes a plurality of first patterns and a plurality of second patterns. For example, as shown in FIG. 3, the unit pattern 31 has first and second patterns 31-1 and 31-2 in the shape of a bar. Unit patterns 31, 32, 33, 34 and 35 are formed so that their first and second patterns are separated from each other by a confirmation interval S, wherein the confirmation intervals 30-1, 30-2, ... 30-5 of the unit patterns differ from each other.

As shown in FIG. 3, the first patterns are designated by the reference numeral 3n-1, the second patterns as 3n-2, and the confirmation intervals as 30-n, where n is 1, 2, ... m. FIG. 3 shows a lateral diffusion confirmation pattern having five unit patterns. The first patterns 31-1, 32-1, 33-1, 34-1 and 35-1 and the second patterns 31-2, 32-2, 33-2, 34-2 and 35-2 are separated from each other by the confirmation intervals 30-1, 30-2, 30-3, 30-4 and 30-5, respectively. In this confirmation pattern, the plurality of unit patterns are arranged together in the shape of stairs, and they have varying confirmation intervals S. The confirmation intervals for each unit pattern is increased gradually from the minimum confirmation interval at a predetermined rate. Here, all of the first patterns 31-1, 32-1, ... 35-1 are connected to each other, and all of the second patterns 31-2, 32-2 ... 35-2 are connected to each other.

A minimum confirmation interval can be 0.1$\mu$m, and the confirmation interval S can be gradually increased by 0.1 $\mu$m to form the unit patterns. In this case, ten unit patterns are required to form a maximum confirmation interval of 1.0 $\mu$m. As a result, a lateral diffusion confirming pattern having the maximum confirmation interval of 1.0 $\mu$m may include 10 unit patterns. Otherwise, a minimum confirmation interval of 0.2 $\mu$m can be used and the confirmation interval can be gradually increased by 0.1 $\mu$m in forming the lateral diffusion confirming pattern. Preferably here, the minimum confirmation interval is 0.2 $\mu$m and the confirmation interval is increased by 0.2 $\mu$m, thereby forming the lateral diffusion confirming pattern having fine unit patterns and the maximum confirmation interval of 1.0 $\mu$m.

First, the pattern for confirming the lateral diffusion of an etch-resistant component is formed on a mask during the fabrication of a photomask. This confirming pattern is transferred onto a photoresist layer formed on a wafer when an actual semiconductor fabrication process is carried out, using the aforementioned surface imaging process.

More specifically, a photoresist layer is formed on a substrate, onto which the pattern formed on the mask is to be transferred. The photoresist layer is exposed with a large exposure energy to expose only portions of the surface of the photoresist layer, using the mask having the lateral diffusion confirming pattern formed thereon. As mentioned above, this confirming pattern is formed on the mask so that a plurality of unit patterns are connected to one another. Then, preparation treatments for silylation are carried out to the exposed substrate. As a result, the exposed portion of the photoresist layer becomes a cross link state.

Then, the photoresist layer is reacted with a silylation agent to diffuse Si into the exposed portion of the photoresist layer, thereby forming an etch-resistant component layer on the photoresist layer. The photoresist layer is etched using the etch-resistant component layer as a mask to obtain a layer containing the diffusion confirming pattern. By doing so, the pattern for confirming the diffusion of the etch-resistant component is transferred from the mask onto the substrate. The pattern transferred and formed on the substrate includes a first photoresist pattern corresponding to the first patterns of the unit patterns, e.g., 31-1 . . . 35-1, of the mask, and a second photoresist pattern corresponding to the second patterns of the unit patterns, e.g., 31-2 . . . 35-2, of the mask. As in the mask, the second photoresist pattern is separated from the first photoresist pattern by a confirmation interval.

Using the diffusion confirming pattern transferred and formed on the substrate, it can be determined how much more diffusion has occurred in the etch-resistant component compared to the original mask pattern. A method for measuring the diffusion distance of the etch-resistant component will be explained below.

First, it is determined if there is a unit pattern, where the first and second photoresist patterns are connected to each other, from the plurality of unit patterns formed on the substrate. Such a unit pattern will not have a confirmation interval. Then, other unit patterns having confirmation intervals are checked. These confirmation intervals are measured to determine the diffusion distance. The diffusion distance during the transfer process is calculated to be one-half of the largest measured confirmation interval. That is, the lateral diffusion distance during the pattern transfer becomes one-half of the largest confirmation interval of the unit patterns formed on the substrate.

Accordingly, by observing the lateral diffusion confirming pattern formed on the substrate, it is possible to find out the degree of lateral diffusion in the transferred pattern. For example, a lateral diffusion confirming pattern formed on a mask and having five unit patterns as shown in FIG. 3 (wherein a minimum confirmation interval is 0.2 $\mu$m and confirmation intervals are gradually increased by 0.2 $\mu$m) is transferred onto a substrate. After the transfer process, the substrate as observed has a zero minimum confirmation interval where there should be a minimum confirmation interval of 0.2 $\mu$m, and the confirmation interval of 0.4 $\mu$m where there should be the interval of 0.4 $\mu$m. Then it is calculated that the degree of lateral diffusion is 0.1 $\mu$m from both sides of the pattern, by dividing 0.2 $\mu$m by 2. If the confirmation interval of 0.4 $\mu$m is not observed, however, and only the interval of 0.6 $\mu$m is observed, then it is presumed that the degree of diffusion is 0.2 $\mu$m (0.4 $\mu$m÷2) from both sides of the pattern.

The pattern for confirming the lateral diffusion of an etch-resistant component according to the present invention can be used for any pattern transfer processes. Using the pattern, any lateral diffusion can be easily verified and determined without using a special apparatus, and during the semiconductor fabrication process. Furthermore, since surface analysis and additional confirmation through cross-section observation of the pattern are unnecessary, where they are carried out for the purpose of detecting lateral diffusion component in the conventional surface imaging process, the fabrication and transfer time is reduced and the waste of wafers can be decreased.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A diffusion confirming pattern for measuring a diffusion distance of an etch-resistant component during a transfer process of a semiconductor device, said pattern comprising:

a first photoresist pattern formed on a substrate according to a first mask pattern; and a second photoresist pattern formed on the substrate according to a second mask pattern, said first mask pattern being separated from said second mask pattern by a predetermined interval, said second photoresist pattern being separated from said first photoresist pattern by an interval, wherein the predetermined interval is compared with the interval between said first and second photoresist patterns to determine the diffusion distance of the etch-resistant component.

2. The diffusion confirming pattern as claimed in claim 1, wherein the predetermined interval is greater than or equal to 0.1 $\mu$m.

3. The diffusion confirming pattern as claimed in claim 2, wherein the predetermined interval is less than or equal to 1.0 $\mu$m.

4. A diffusion confirming pattern for measuring a diffusion distance of an etch-resistant component during a transfer process of a semiconductor device, said pattern comprising:

at least two diffusion confirming unit patterns, each of said unit patterns including a first photoresist pattern formed on a substrate according to one of first mask patterns, and a second photoresist pattern formed on the substrate according to one of second mask patterns, at least one of said second photoresist patterns being separated from corresponding said first photoresist pattern by an interval, wherein the first photoresist pattern of one of the diffusion confirming unit patterns is connected to the first photoresist-pattern of another one of the diffusion confirming unit patterns, and wherein the interval between said first and second photoresist patterns is compared with one of intervals between the first and second mask patterns to determine a diffusion distance of an etch-resistant component.

5. The diffusion confirming pattern as claimed in claim 4, wherein said first photoresist patterns of said diffusion confirming unit patterns are connected to each other, and said second photoresist patterns of said diffusion confirming unit patterns are connected to each other, whereby a plurality of intervals are formed.

6. The diffusion confirming pattern as claimed in claim 5, wherein the intervals between said first and second photoresist patterns differ from each other.

7. The diffusion confirming pattern as claimed in claim 6, wherein the intervals between the first and second mask patterns increase at a fixed rate.

8. The diffusion confirming pattern as claimed in claim 5, wherein said first and second photoresist patterns are formed of a silylation layer and a photoresist.

9. The diffusion confirming pattern as claimed in claim 4, wherein the intervals between said first and second photoresist patterns are different from one another.

10. The diffusion confirming pattern as claimed in claim 4, wherein the intervals between the first and second mask patterns increase at a fixed rate from a predetermined minimum interval.

11. The diffusion confirming pattern as claimed in claim 4, wherein the intervals between the first and second mask patterns increase incrementally from 0.1 $\mu$m to 1.0 $\mu$m.

12. The diffusion confirming pattern as claimed in claim 4, wherein the intervals between the first and second mask patterns increase incrementally from 0.2 $\mu$m to 1.0 $\mu$m.

* * * * *